United States Patent [19]

Bianchini et al.

[11] Patent Number: 5,220,292
[45] Date of Patent: Jun. 15, 1993

[54] MICROWAVE OSCILLATOR WITH NOISE DEGENERATION FEEDBACK CIRCUIT

[75] Inventors: Michael J. Bianchini, North Middleboro; Richard A. Michalik, Andover; John A. Chiesa, Dracut; Joanne Mistler, Marlboro, all of Mass.

[73] Assignee: Raytheon Company, Lexington, Mass.

[21] Appl. No.: 815,981

[22] Filed: Jan. 2, 1992

[51] Int. Cl.$^5$ .................. H03L 7/085; H03L 7/16
[52] U.S. Cl. .................................... 331/1 R; 331/9; 331/16
[58] Field of Search .............. 331/1 R, 16, 18, 25, 331/34, 175, 187, 9; 356/35.5

[56] References Cited

U.S. PATENT DOCUMENTS

| | | |
|---|---|---|
| 3,895,312 | 7/1975 | Tipon . |
| 3,992,679 | 11/1976 | Isono . |
| 4,048,580 | 9/1977 | Campbell et al. . |
| 4,415,854 | 11/1983 | Remy . |
| 4,481,484 | 11/1984 | Campbell . |
| 4,555,678 | 11/1985 | Galani et al. . |
| 4,631,498 | 12/1986 | Cutler ........................ 331/9 |
| 4,692,714 | 9/1987 | Galani . |
| 4,746,878 | 5/1988 | Cutler ........................ 331/9 |
| 4,758,800 | 7/1988 | DiBiase et al. . |
| 5,032,800 | 7/1991 | Galani et al. . |

FOREIGN PATENT DOCUMENTS 0071327 5/1980 Japan .................... 331/1 R

Primary Examiner—David Mis
Attorney, Agent, or Firm—Donald F. Mofford; Richard M. Sharkansky

[57] ABSTRACT

A microwave oscillator is shown to include an oscillator having an output and a control port and a feedback circuit disposed between the output and the control port of the oscillator. The feedback circuit includes a modulated laser, having an input and an output, the input responsive to a portion of a signal from the output of the oscillator and a photo detector having an input and an output, the input of the photo detector responsive to a signal from the output of the modulated laser delayed by a predetermined amount of time. The feedback circuit further includes a detector having a first and a second input and an output, the first input of the detector responsive to a signal from the output of the photo detector, the second input responsive to a portion of the signal from the output of the oscillator shifted in phase to be in phase quadrature with the signal at the first input of the detector and the output of the detector coupled to the control port of the oscillator. With such an arrangement, a microwave oscillator having improved FM noise performance than known microwave oscillators is provided.

16 Claims, 6 Drawing Sheets

MICROWAVE OSCILLATOR WITH NOISE DEGENERATION FEEDBACK CIRCUIT

BACKGROUND OF THE INVENTION

This invention pertains generally to microwave oscillators and more particularly to a low-noise microwave oscillator.

It is well known that many advanced electronic systems for communication and navigation require circuits, including oscillator circuits, having low-noise for low noise applications. Such low noise applications including space communications, electronic warfare countermeasures and modern radar techniques. In a microwave oscillator, frequency modulation (FM) noise is a problem due to the noise characteristics of the components of the oscillator. In many applications, it is advantageous to reduce the FM noise characteristics of the microwave oscillator. For example, lower noise is a key to extending the maximum detection range of a radar missile. Various techniques for lowering the FM noise of a microwave oscillator have been described. For example, a technique for degenerating low frequency FM noise arising within a microwave oscillator is described in U.S. Pat. No. 5,032,800, issued Jul. 16, 1991, entitled "Tunable Oscillator with Noise Degeneration" (which patent is assigned to the same assignee as this application). In said Patent, it is described that a microwave oscillator includes an amplifier and a feedback circuit disposed about the amplifier. The feedback circuit includes a resonator having a first port and a second port and a voltage-controlled phase shifter having a input port, an output port and a control port, the input port of the voltage-controlled phase shifter connected to the output port of the amplifier and the output port of the voltage-controlled phase shifter coupled to a port of the resonator. The oscillator further includes a circuit responsive to signals from the output of the voltage-controlled phase shifter and the first port of the resonator to provide a control signal to the control port of the voltage-controlled phase shifter for degenerating low frequency FM noise arising with in the amplifier.

Although such a technique is useful in many applications, the noise performance of a microwave oscillator is a very important consideration and lower noise is a key to extending the maximum detection range of a radar. For example, in a doppler radar, noise generated at base band frequencies is upconverted and occurs in the region from the carrier at the order of expected doppler frequency shifts and will reduce the subclutter visibility of the radar. Therefore, it is desirable to provide a very precise, yet easily changeable microwave frequency signal source with a highly pure stable frequency output signal.

SUMMARY OF THE INVENTION

With the foregoing background of this invention in mind, it is a primary object of this invention to provide a tunable microwave oscillator having low FM noise.

It is another object of this invention to provide an improved microwave oscillator.

The foregoing and other objects of this invention are generally attained by providing a microwave oscillator including an oscillator having an output and a control port and a feedback circuit disposed between the output and the control port of the oscillator. The feedback circuit includes a modulated laser, having an input and an output, the input responsive to a portion of a signal from the output of the oscillator and a photo detector having an input and an output, the input of the photo detector responsive to a signal from the output of the modulated laser delayed by a predetermined amount of time. The feedback circuit further includes a detector having a first and a second input and an output, the first input of the detector responsive to a signal from the output of the photo detector, the second input responsive to a portion of the signal from the output of the oscillator shifted in phase to be in phase quadrature with the signal at the first input of the detector and the output of the detector coupled to the control port of the oscillator. With such an arrangement, a microwave oscillator having improved FM noise performance than known microwave oscillators is provided.

In accordance with a further aspect of the present invention, a microwave frequency signal source includes an oscillator, responsive to a control signal, for providing a microwave frequency output signal and a laser, responsive to a portion of the microwave frequency output signal, for providing a modulated optical signal, the modulated optical signal further being time delayed by a predetermined amount of time. The microwave frequency signal source further includes a photo detector, responsive to the time delayed modulated optical signal, for providing a microwave feedback signal having a phase. The microwave frequency signal source still further includes a phase detector, responsive to the microwave feedback signal and a portion of the microwave frequency output signal having a phase in phase quadrature with the phase of the microwave feedback signal, for providing the control signal to the oscillator. With this arrangement, a microwave frequency signal source is provided having an output signal with the phase noise imparted to the signal provided therefrom being reduced and accordingly the output signal from the microwave frequency signal source will have a lower frequency modulation noise level. Since a portion of the microwave frequency output signal is phase detected with a portion of the microwave frequency output signal delayed in time by a predetermined amount of time, the output of the phase detector provides a signal which will decrease noise in the oscillator. Reduction in noise contributed by the circuit elements will provide a concomitant reduction in the frequency noise of the output signal from the microwave frequency signal source.

BRIEF DESCRIPTION OF THE DRAWINGS

For a more complete understanding of this invention, reference is now made to the following description of the accompanying drawings, wherein.

DESCRIPTION OF THE PREFERRED EMBODIMENT

Figure 1:
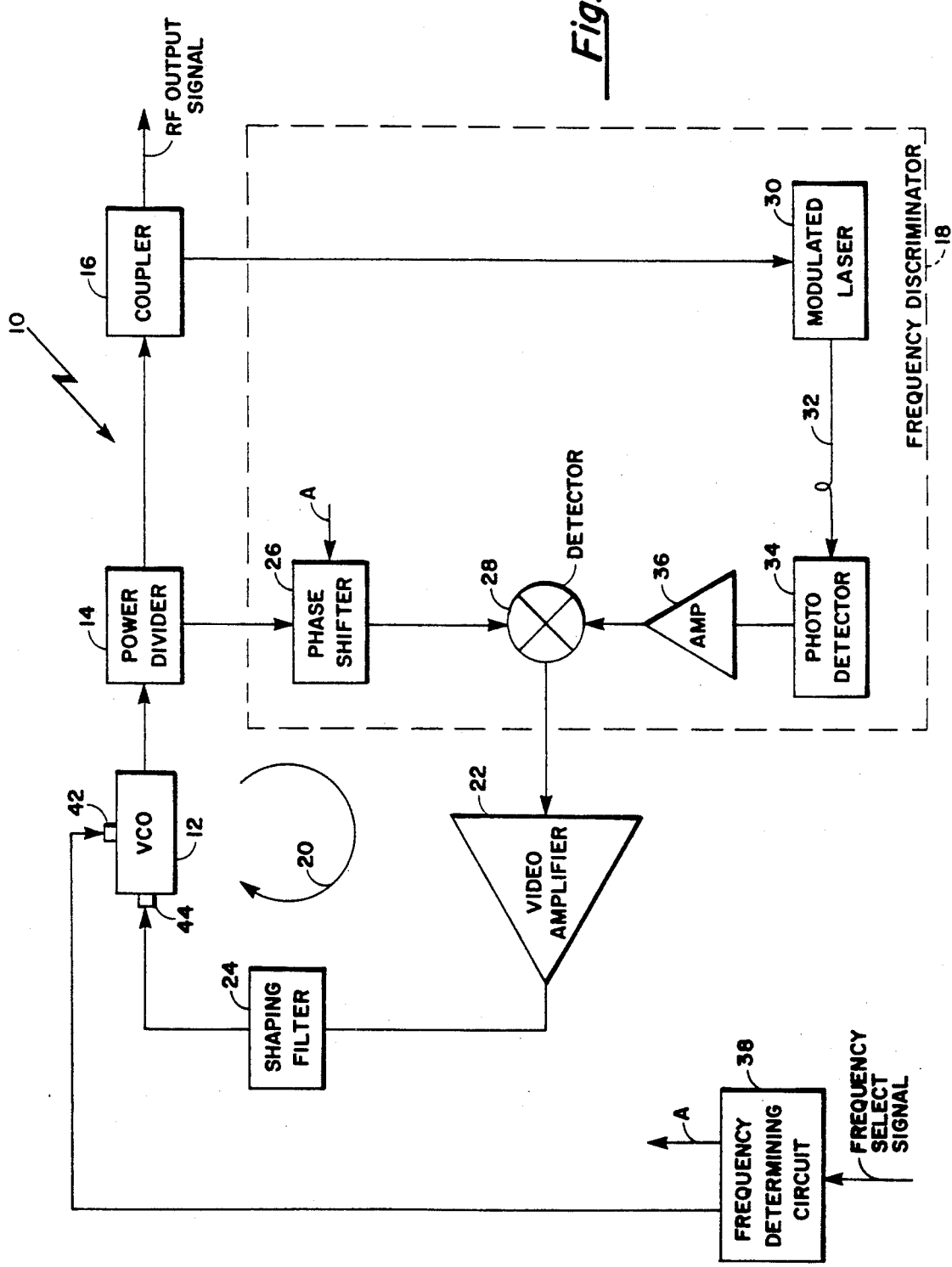
FIG. 1 is a block diagram of a low noise oscillator according to this invention.

Referring now to FIG. 1, a microwave frequency signal source 10 is shown to include a microwave, for example a C-Band, voltage-controlled oscillator (VCO 12). The VCO 12 provides an output signal with a predetermined frequency in response to a coarse control signal fed to a coarse control port 42 of the VCO 12 and a fine control signal fed to a fine control port 44 of the VCO 12. The output of the VCO 12 is connected to an input of a power divider 14 having a first and a second output. The first output of the power divider 14 is connected to an input of a coupler 16 having a first and a second output. The first output of the coupler 16 provides the output of the microwave frequency signal source 10. The second output of the power divider 14 is connected to a first input of a frequency discriminator 18. The second output of the coupler 16 is connected to a second input of the frequency discriminator 18. The output of the frequency discriminator 18 is connected to an input of a video amplifier 22 having also an output. The output of the video amplifier 22 is connected to an input of a shaping filter 24 having also an output which is connected to the fine control port 44 of the VCO 12. It should be appreciated that the power divider 14, the coupler 16, the frequency discriminator 18, the video amplifier 22 and the shaping filter 24 provides a feedback loop 20 for the VCO 12.

The frequency discriminator 18 includes a voltage-controlled phase shifter 26 having an input connected to the second output of the power divider 14, the voltage-controlled phase shifter 26 also having an output and a control port. The output of the voltage-controlled phase shifter 26 is connected to a first input of a detector 28 having also a second input and an output. The frequency discriminator 18 further includes a modulated laser 30 having an input which is connected to the second output of the coupler 16. An output of the modulated laser 30 is connected to an input end of a fiber-optic cable 32 which provides a predetermined time delay. An output end of the fiber-optic cable 32 is connected to an input of a photo detector 34 having also an output which is connected to an input of an amplifier 36. An output of the amplifier 36 is connected to the second input of the detector 28. An output of the detector 28 provides the output of the frequency discriminator 18 and is connected to the input of the video amplifier 22. With such an arrangement, the feedback loop 20 provides the fine control signal to the fine control port 44 of the VCO 12 to reduce frequency modulation (FM) noise in the output signal of the voltage-controlled oscillator 12. Thus, dither in the output frequency of the output signal of the VCO 12 will be reduced.

With the above described arrangement, an output signal at the output of the VCO 12 is fed to the input of the power divider 14 wherein a first portion of the signal is fed to the input of the coupler 16 and a second portion of the signal is fed to the input of the voltage-controlled phase shifter 26. A first portion of the input signal fed to the input of the coupler 16 is provided as the RF output signal of the microwave frequency signal source 10 and a second portion of the input signal fed to the input of the coupler 16 is fed to the modulated laser 30. The modulated laser 30 is capable of providing a modulated optical output signal at the output thereof in response to a modulating input signal. The optical output signal of the modulated laser 30 is amplitude modulated (AM) at a modulation rate in accordance with the frequency of the input signal. Thus, AM modulation in the optical output signal is indicative of the frequency of the RF output signal of the microwave frequency signal source 10. The optical output signal is fed to the input end of the fiber-optic cable 32 here providing a fiber-optic delay line with a time delay of 2.5 microseconds. The signal at the output end of the fiber-optic cable 32 is a delayed optical signal with the characteristics of the optical signal fed into the fiber-optic cable 32 but having a time delay of 2.5 microseconds. The delayed optical signal is fed to the input of the photo detector 34 wherein the photo detector 34 provides an output signal (microwave feedback signal) having a frequency corresponding with the frequency of the RF output signal of the microwave frequency signal source 10 but delayed in time by 2.5 microseconds. The output signal of the photo detector 34 is fed to the amplifier 36 wherein said signal is amplified and then fed to the second input of the detector 28.

As described hereinabove, the second portion of the VCO output signal at the second output of the power divider 14 is fed to the input of the voltage-controlled phase shifter 26. The voltage-controlled phase shifter 26 provides a predetermined amount of phase shift to the signal fed to the input thereof as determined by a control signal fed to the control port thereof. The amount of phase shift imparted upon an input signal is determined such that the signal fed to the first input of the detector 28 will be shifted in phase to be in phase quadrature with the signal at the second input of the phase detector 28. The detector 28 provides an output signal having a voltage indicative of phase difference between the two signals fed thereto.

It should be appreciated, if two signals having the same frequency, but with one of the signals having a phase difference of 90° with the other signal, are fed into the detector 28 (here a phase detector) then an output signal of the detector 28 will have a non-varying nominal predetermined voltage here equal to zero volts. If the frequency of one of the input signals varies a small amount, then the two input signals will have a phase difference of something other than 90° and the output signal of the detector 28 will have a voltage different than the non-varying nominal predetermined voltage, the amount of difference indicative of the amount of phase difference between the two input signals of the detector 28. In the present embodiment, the signal at the first input of the detector 28 is indicative of an instantaneous RF output signal, meaning the RF output signal without having been subjected to a desired time delay. The signal at the second input of the detector 28 is indicative of a time delayed RF output signal, meaning the RF output signal having been subjected to a time delay, here the time delay being 2.5 microseconds. Thus, the output signal of the phase detector 28 will have a voltage with a magnitude indicative of the difference between the phase of the instantaneous RF output signal and the phase of the time delayed RF signal. As such, if the frequency of the instantaneous RF output signal varies, the phase of the signal at the first input of the detector 28 varies whereas the phase of the signal at the second input of the detector 28 remains constant since the signal at the second input is indicative of the RF output signal of 2.5 microseconds earlier, resulting in a larger variation in the magnitude of the voltage change of the output signal of the detector 28. (It should be appreciated, the longer the time delay, the larger the voltage change of the time output signal.) The output signal from the detector 28 is fed to the video amplifier wherein said signal is amplified. The signal from the video amplifier 22 is fed to the shaping filter 24 wherein said signal is filtered and fed to the fine control port 44 of the VCO 12. A DC offset voltage may be summed into a second input port of the video amplifier 22 in order to satisfy the biasing requirement of the fine control port 44 of the voltage-controlled oscillator 12. As described hereinabove, with a larger variation in the magnitude of the voltage change of the output signal of the detector 28 for a predetermined amount of frequency variation, the fine control signal at the fine control port 44 can more readily vary the output frequency of the output signal of the VCO 12 to offset such a change.

The microwave frequency signal source 10 also includes a frequency determining circuit 38, which in response to a frequency select signal from a controller (not shown), provides a control signal to the coarse control port 42 of the VCO 12. The control signal at the coarse control port 42 of the VCO 12 is used to determine the output frequency of the output signal of the microwave frequency signal source 10, correlating to the frequency select signal fed to the frequency determining circuit 38. The frequency determining circuit 38 further provides the control signal to the control port of the voltage-controlled phase shifter 26. The latter ensures that a 90° phase difference between the input signals at the input ports of the detector 28 is maintained as the selected output frequency of the output signal of the microwave frequency signal source 10 is changed.

It should now be appreciated that the feedback loop 20 is also a frequency-locked loop (FLL) which causes the frequency of the signal out of the voltage-controlled oscillator (VCO 12) to be nominally locked to the frequency which corresponds to the zero crossing of the output signal of the phase detector 28 and as selected by the coarse control port 42 of the VCO 12. An undesired change of frequency in the RF output signal will result in a change in the output signal of the frequency discriminator 18. The latter will result in a change in the fine control signal fed to the fine control port of the VCO 12, thus minimizing undesired changes in the frequency of the output signal of microwave frequency signal source 10.

Figure 2:
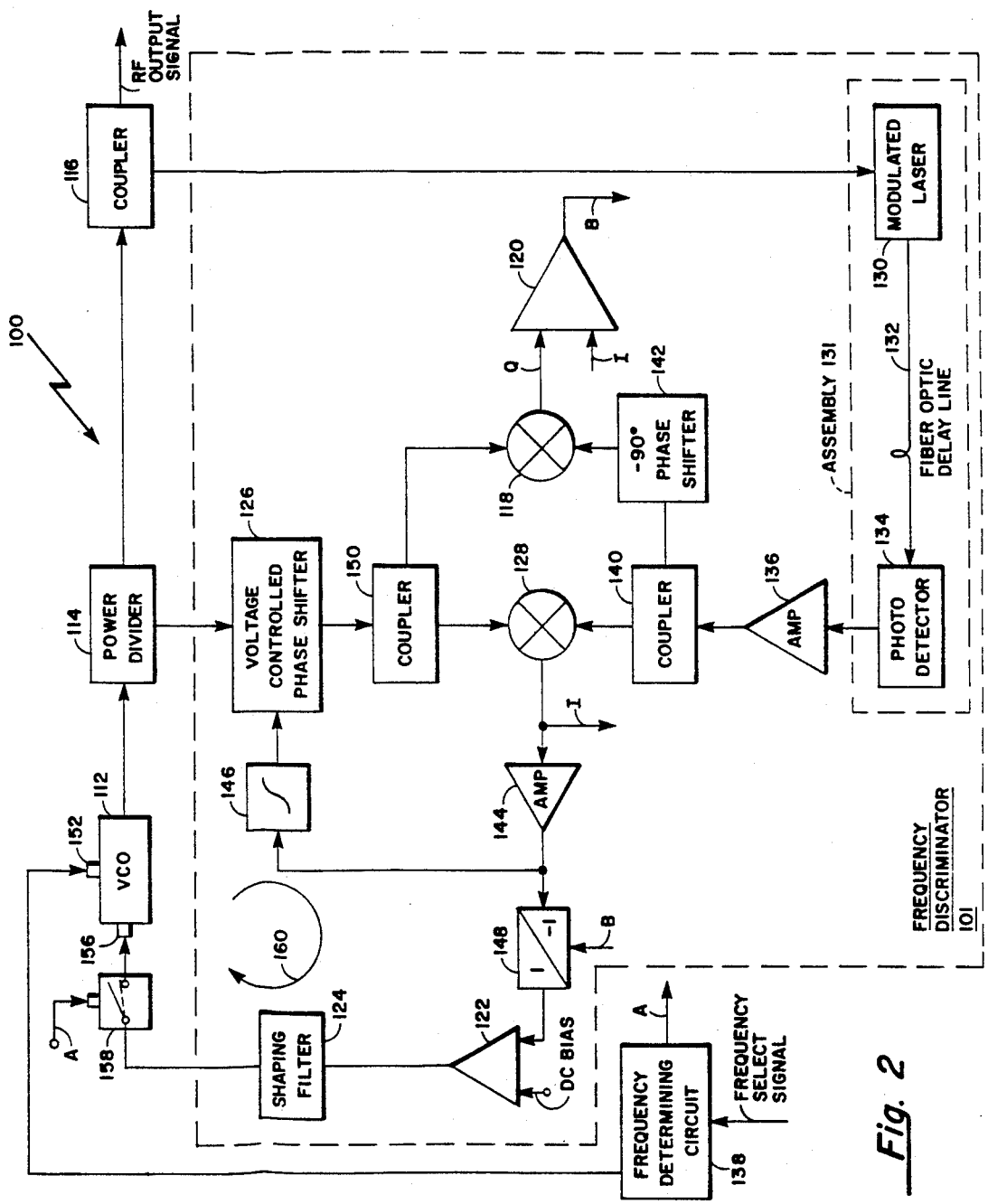
FIG. 2 is a block diagram of an alternate embodiment of a low noise oscillator according to this invention.

Referring now to FIG. 2, a microwave oscillator 100 is shown to include a voltage-controlled oscillator (VCO 112) having an output, a coarse control port 152 and a fine control port 158. The output of the VCO 112 is connected to an input of a power divider 114 having a first and second output. The first output of the power divider 114 is connected to an input of a coupler 116 having a first and second output. The first output of the coupler 116 provides the output of the microwave oscillator 100.

The second output of the power divider 114 is connected to an input of a voltage-controlled phase shifter 126 having an output and a control port. The output of the voltage-controlled phase shifter 126 is connected to an input of a coupler 150. A first output of the coupler 150 is connected to a first input of a phase detector 128 having also a second input and an output. A second output of the coupler 150 is connected to a first input of a phase detector 118 having also a second input and an output.

The second output of the coupler 116 is connected to an input of a modulated laser 130. An output of the modulated laser 130 is connected to an input end of a fiber-optic delay line 132 provided by a fiber-optic cable and here having a delay of one microsecond, the fiber-optic delay line 132 further having an output end which is connected to an input of a photo detector 134. An output of the photo detector 134 is connected to an input of an amplifier 136 having also an output which is connected to an input of a coupler 140. A first output of the coupler 140 is connected to the second input of the phase detector 128. A second output of the coupler 140 is connected to an input of a −90° phase shifter 142 having also an output which is connected to the second input of the phase detector 118.

The output of the detector 128 is connected to a second input of an amplifier 120 having also a first input and an output. The output of the phase detector 128 is also connected to an input of an amplifier 144. An output of the amplifier 144 is connected to an input of an integrator 146 having also an output which is connected to the control port of the voltage-controlled phase shifter 126. The output of the amplifier 144 is also connected to an input of a selectable inverter 148 having also an output and a control port. The selectable inverter 148 will either invert or not invert a signal fed thereto as determined by a control signal fed to the control port thereof. To provide the control signal to the control port of the switchable inverter 148, the output of the phase detector 118 is connected to the first input of the amplifier 120 and the output of the amplifier 120 is connected to the control port of the switchable inverter 148.

The output of the switchable inverter 148 is connected to a first input of a loop amplifier 122 having also a second input and an output. The output of the loop amplifier 122 is connected to an input of a shaping filter 124 having also an output which is connected to an input of a switch 158 having also an output and a control port. The output of the switch 158 is connected to the fine control port 156 of the VCO 112. A DC offset bias signal may be summed into the second input of the loop amplifier 122 to satisfy the biasing requirement of the fine control port 156 of the voltage-controlled oscillator 112. The above-described circuitry provides the elements for a frequency discriminator 101 which provides a feedback loop 160 for the VCO 112. A frequency determining circuit 138, which in response to a frequency select signal from a controller (not shown), provides a control signal to the coarse control port 152 of the VCO 112. The frequency determining circuit 138 further provides a control signal to the control port of the switch 158.

With the above-described arrangement, an output signal at the output of the VCO 112 is fed to the input of the power divider 114 wherein a first portion of the signal is fed to the input of the coupler 116 and a second portion of the signal is fed to the input of the voltage-controlled phase shifter 126. A first portion of the signal fed to the input of a coupler 116 is provided as the RF output signal of the microwave oscillator 100 and a second portion of the signal fed to the input of a coupler 116 is fed to the modulated laser 130. The modulated laser 130 is capable of providing a modulated optical signal at the output thereof in response to an input signal. The optical signal of the modulated laser 130 is amplitude modulated (AM) at a modulation rate in accordance with the frequency of the input signal. The optical signal is fed to the input end of the fiber-optic delay line 132 here providing a time delay of one microsecond. The signal at the output end of the fiber-optic delay line 132 is a delayed optical signal with the characteristics of the optical signal fed into the fiber-optic delay line 132 but having a time delay of one microsecond. The delayed optical signal is fed to the input of the photo detector 134 wherein the photo detector 134 provides an output signal having a frequency corresponding to the frequency of the RF output signal of the microwave oscillator 100 but delayed in time by one microsecond. The modulated laser 130, the fiber-optic cable 132 and the photo detector 134 can be provided by assembly 131. Here, assembly 131 is a Fiberoptic Delay, manufactured by Ortel Corp., 2015 West Chestnut Street, Alhombra, Calif. 91803, and having a part number 5002B-0100. The output signal of the photo detector 134 within the assembly 131 is fed to the amplifier 136 wherein said signal is amplified and then fed to the input of the coupler 140. A first portion of the signal at the input of the coupler 140 is fed to the second input of the detector 128 and a second portion of the signal at the input of the coupler 140 is fed to the input of the −90° phase shifter 142. The −90° phase shifter 142 provides 90° of phase shift to a signal fed to the input thereof at the output thereof. The signal at the output of the −90° phase shifter is fed to the second input of the detector 118.

As described herein above, the second portion of the VCO output signal at the second output of the power divider 114 is fed to the input of the voltage-controlled phase shifter 126. The voltage-controlled phase shifter 126 provides a predetermined amount of phase shift to the signal fed to the input thereof as determined by a control signal fed to the control port thereof. The signal a the output of the voltage-controlled phase shifter 126 is fed to the input of a coupler 150. A first portion of the signal fed to the input of the coupler 150 is fed to the first input of the detector 128 and a second portion of the signal at the input of the coupler 150 is fed to the first input of the detector 118. The amount of phase shifted imparted upon a signal by the voltage-controlled phase shifter 126 is determined such that the signal fed to the first input of the detector 128 will be shifted in phase to be in phase quadrature with the signal at the second input of phase detector 128. The detector 128 (here a phase detector) provides an output signal having a voltage indicative of the phase difference between the two signals fed thereto. In the present embodiment, the signal at the first input of the detector 128 is indicative of an instantaneous RF output signal, meaning the RF output signal without having been subjected to a desired time delay and the signal at the second input of the detector 128 is indicative of a time delayed RF output signal, meaning the RF output signal having been subjected to a time delay, here the time delay being one microsecond. Thus, the output of the phase detector 128 will have a voltage with a magnitude indicative of the difference between the phase of the instantaneous RF output signal and the phase of the time delayed RF signal. The output signal from the detector 128 is fed to the input of the amplifier 144 and to the second input of the amplifier 120. The amplifier 144 amplifies the signal at the input thereof and provides said signal at the output thereof which in turn is fed to the input of the selectable inverter 148 and the input of the integrator 146. The integrator 146 integrates the signal at the input thereof and provides said integrated signal at the output thereof which in turn is fed as the control signal to the voltage-controlled phase shifter 126. The integrator 146 will automatically drive the phase shifter 126 until an approximately zero volts average signal is obtained at the detector 128 output. The resulting effect is to automatically maintain phase quadrature for the two inputs to detector 128. The signal at the input of the selectable inverter 148 is either inverted or not inverted by the selectable inverter 148 as determined by the control signal fed to the control port of the selectable inverter 148. The output signal of the selectable inverter 148 is fed to the input of an amplifier 122 wherein said signal is summed with a DC bias signal as necessary and amplified. The output signal of the amplifier 122 is fed to the input of the shaping filter 124 wherein said signal is filtered and in turn fed to the input of a switch 158. The switch 158 is either in the open or closed position as determined by a control signal at the control port thereof and when said switch is in the closed position, the signal fed to the input thereof is in turn fed to the fine control port 156 of the VCO 112.

Digressing briefly now here for a moment, it will be noted by those of skill in the art that the frequency discriminator 101 will provide an appropriate DC voltage signal to the fine control port 156 of the VCO 112 as the output signal of the VCO 112 varies in frequency. The frequency discriminator 101 provides a transfer function in the form of a sinusoidal discriminator curve. The slope of such discriminator curve at the zero-crossing is controlled by the amount of time delay provided by the fiber-optic delay line 132. It should be appreciated, as the frequency of the output signal of the VCO 112 increases, the frequency discriminator 101 will first provide a DC output signal with a negative going characteristic at a first zero crossing as the frequency increases and then provide a DC output signal with a positive going characteristic at a second zero crossing as the frequency increases. Such characteristics then repeat themselves. The latter introduces an ambiguity. At a frequency with a zero crossing having a negative going slope, as the frequency of the output signal of the VCO 112 increases, the DC output signal provided by the frequency discriminator 101 decreases. At a frequency with a zero crossing having a positive going slope, as the frequency of the output signal of the VCO 112 increases, the DC output signal provided by the frequency discriminator 101 increases. Accordingly, the selectable inverter 148 provides either an inverted signal or a non-inverting signal, as necessary, to provide negative feedback (stability). To correct for the ambiguity, negative feedback is restored by selecting either the inverting or the non-inverting characteristic of the selectable inverter 148 as determined by the control signal at the control port thereof. The control signal for the selectable inverter 148 is provided by the output of the amplifier 120. As described hereinabove, one of the two inputs to the amplifier 120 is provided by the output of the detector 128 and the other one of the two inputs to the amplifier 120 is provided by the output of the detector 118.

It should be appreciated by those of skill in the art, when the frequency discriminator 101 is operating at a negative going zero crossing, the voltage of the signal out of the detector 128 will be greater than the voltage of the signal out of the detector 118 and when the frequency discriminator 101 is operating at a positive going zero crossing, the voltage of the signal out of the detector 128 will be less than the voltage of the signal out of the detector 118. Thus, if the output signal of the detector 128 is used as a reference signal at the input of the amplifier 120, then the output signal of the amplifier 120 will be a positive signal when the frequency discriminator 101 is operating a positive going zero crossing and the output signal of the amplifier 120 will be negative when the frequency discriminator 101 is operating at a negative going zero crossing. Using the output of the amplifier 120 as a control signal for the selectable inverter 148, the selectable inverter 148 is then selected to be either in the inverting mode or the non-inverting mode as necessary. The latter ensures the feedback loop 160 is configured to exhibit negative feedback (stability).

Figure 2A:
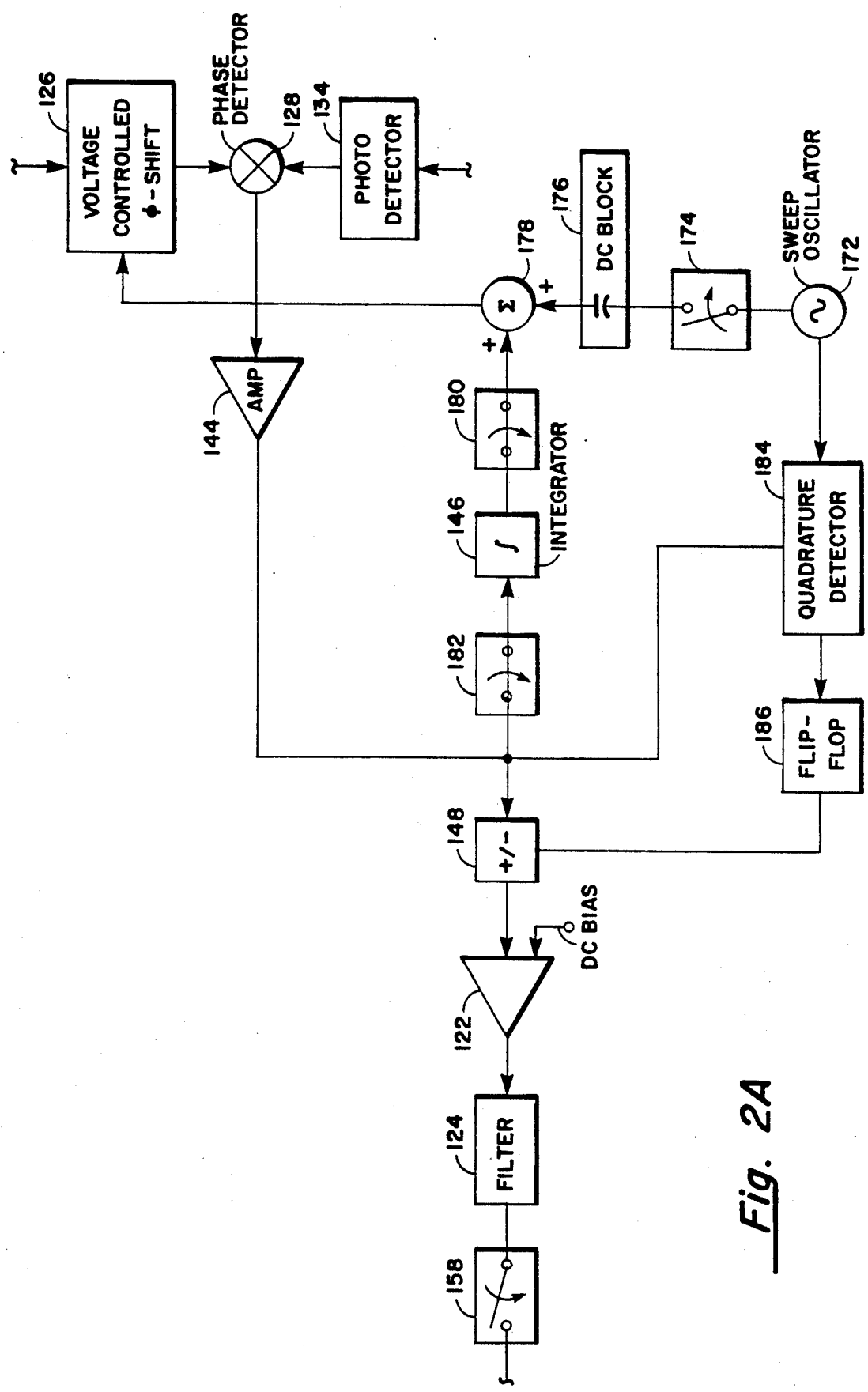
FIG. 2A is a block diagram of an alternative embodiment of a portion of the low noise oscillator shown in FIG. 2.

Referring now also to FIG. 2A, an alternative technique is shown to control the selectable inverter 148. A sinusoidal sweep oscillator 174 having an output which is connected to an input of a switch 174 provides a sinusoidal output signal. An output of the switch 174 is connected, via a DC blocking capacitor 176, to a first input of a summing network 178. An output of the summing network is connected to the control port of the voltage-controlled phase shifter 126. A switch 182 is positioned between the output of the amplifier 144 and the input of the integrator 146. A switch 180 is connected between the output of the integrator 146 and a second input of the summing network 178. Completing the alternate embodiment is a video quadrature detector 184 having a first and a second input with the first input connected to the output of the amplifier 144 and the second input connected to the output of the sinusoidal sweep oscillator 172. An output of the quadrature detector 184 provides a control signal to control a flip-flop 186 having an output which is connected to the control port of the selectable inverter 148.

The output signal of the sinusoidal sweep oscillator 172 is connected to the control port of the voltage-controlled phase shifter by closing switch 174 and opening switches 158, 180 and 182. The latter sweeps the voltage-controlled phase shifter 126 resulting in a sinusoidal voltage signal at the output of the phase detector 128. The sinusoidal voltage signal at the output of the phase detector 128 and the sinusoidal sweep signal from the output of the sinusoidal sweep oscillator 172 are fed as inputs to the video quadrature detector 184. The output signal controls the flip-flop 186 to provide the control signal to the selectable inverter 148 to ensure negative feedback is provided within the frequency discriminator 101. With the latter completed, switch 174 is opened and switches 180 and 182 are closed. Any DC output signal from the phase detector 182 is integrated by the integrator 146 and fed to the control port of the voltage-controlled phase shifter 16 to change the insertion phase change provided by the voltage-controlled phase shifter 126 during the DC output signal of the frequency discriminator 101 to zero volts. The switch 158 is then closed and the feedback loop 160 changes to the tracking mode to maintain low noise.

To set the operating frequency of the microwave oscillator 100, the frequency determining circuit 138 provides a control signal to the switch 158 to set the switch 158 in the open position. The frequency determining circuit 138 further provides the control signal to the coarse control port 152 of the VCO 112 to set the output frequency of the output signal of the microwave oscillator 100. Once enough time has elapsed for the VCO 112 to settle at the new frequency as determined by the coarse control signal at the control port 152, the frequency determining circuit 138 provides a control signal to the switch 158 to close the switch 158. The latter connects the output signal of the frequency discriminator 101 to the fine control port 156 of the VCO 112 activating the feedback loop 160.

Referring momentarily back to FIG. 1, the fiber-optic cable 32, there providing a time delay of 2.5 microseconds, controls the frequency spacing of the output frequency of the VCO 112. Thus, as the control signal fed to the control port 42 of the VCO 12 is adjusted, the output frequency of the VCO 12 will jump every 400 kilohertz (corresponding to the reciprocal of 2.5 microseconds). Fine tuning of the frequency between the 400 kilohertz jumps is accomplished by adjusting the control signal of the voltage-controlled phase shifter 26. Thus, the time delay of the fiber-optic cable 32 controls the coarse frequency spacing of the output signal of the VCO 12.

Referring now again to FIG. 2 and with the latter in mind, a technique was shown to change the coarse control frequency spacing from $1/T$, where T is the time delay of the fiber-optic delay line 132, to $\frac{1}{2}T$. Since the feedback loop 160 of the frequency discriminator 101 can be locked on either the negative going crossing or the positive going crossing, the frequency spacing of the microwave oscillator 100 is set by $\frac{1}{2}T$, here 500 kHz. If the frequency discriminator 101 is not at a zero crossing, the output of the amplifier 144 will cause the output of the integrator 146 to ramp, thereby shifting the voltage-controlled phase shifter 126 and causing the output of the amplifier 144 to move towards zero volts, indicating a crossover point has been reached. In this manner, the frequency discriminator 101 is controlled to always operate at a crossover (automatically) thereby yielding the best FM noise performance for the microwave oscillator 100.

Figure 3:
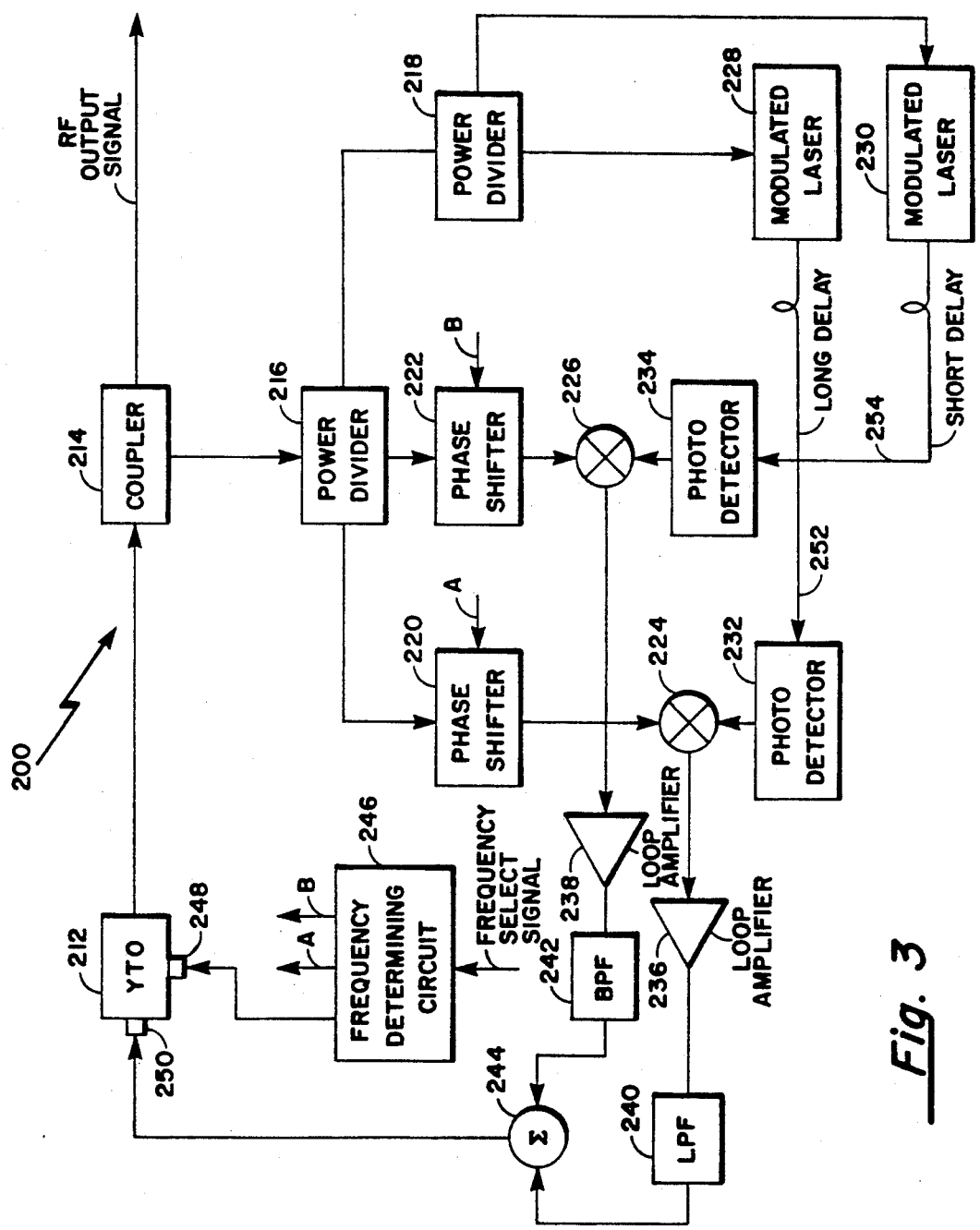
FIG. 3 is a block diagram of another alternate embodiment of a low noise oscillator according to this invention.

Referring now to FIG. 3, a microwave oscillator 200 is shown to include a yttrium-iron-garnet (YIG) tuned oscillator 212 (YTO 212) having a coarse control port 248 and a fine control port 250 and an output. The output of the YTO 212 is connected to an input of a coupler 214 having a first output and a second output. The first output of the coupler 214 provides the output of the microwave oscillator 200. The second output of the coupler 214 is connected to an input of a three-way power divider 216. A first output of the power divider 216 is connected to an input of a voltage-controlled phase shifter 220. An output of the phase shifter 220 is connected to a first input of the phase detector 224 having also an second input and an output. A second output of the power divider 216 is connected to an input of a voltage-controlled phase shifter 222. An output of the phase shifter 222 is connected to a first input of a phase detector 226 having also a second input and an output. A third output of the power divider 216 is connected into an input of a power divider 218 having also a first and a second output.

The first output of the power divider 218 is connected to an input of a modulated laser 228. An output of the modulated laser 228 is connected to an input end of a long delay fiber-optic cable 252, here having a time delay of 2.5 microseconds. An output end of the long delay fiber-optic cable 252 is connected to an input of a photo detector 232. An output of the photo detector 232 is connected to the second input of the phase detector 224.

The second output of the power divider 218 is connected to an input of a modulated laser 230. An output of the modulated laser 230 is connected to an input end of a short delay fiber-optic cable 254, here having a time delay of 0.236 microseconds. An output end of the short delay fiber-optic cable 254 is connected to an input of a photo detector 234 having also an output which is connected to the second input of the phase detector 226.

The output of the phase detector 224 is connected to an input of a loop amplifier 236 having also an output which is connected to an input of a lowpass filter 240. An output of the lowpass filter 240 is connected to a first input of a summing network 244 having also a second input and an output. The output of the phase detector 226 is connected to an input of a loop amplifier 238 having also an output which is connected to an input of bandpass filter 242. An output of the bandpass filter 242 is connected to the second input of the summing network 244. The output of the summing network 244 is connected to the fine control port 250 of the YTO 212.

Before proceeding with a detailed description of the contemplated microwave oscillator 200, it should be noted that, for the sake of drawing clarity, only those elements required for an understanding of the operation of the invention are shown. Thus, for example, components such as signal amplifiers and control logic circuitry have not been shown although components of such nature would be included as necessary in an operational microwave oscillator.

It should be appreciated, the microwave oscillator 200 includes a feedback circuit with two delay lines. A long delay line, provided by the long delay fiber-optic cable 252, is used to discern the phase noise close to the output frequency of the RF output signal (hereinafter also referred to as the carrier frequency). A control loop with the loop amplifier 236 and the low pass filter 240 is used to degenerate the phase noise of the YTO 212 close to the carrier frequency. At higher offset frequencies from the carrier frequency, the long delay line loop begins to be unstable near 1/T (where T is the delay line length time) since the frequency discriminator imparts a video phase shift that would destroy the phase margin of the control loop, resulting in an unstable loop. As such, a short delay line provided by the short delay fiber-optic cable 254 will dominate with a second control loop, including the loop amplifier 238 and the bandpass filter 242, to degenerate the phase noise of the YTO 212 further away from the carrier frequency.

It should be appreciated, a long delay line, here provided by long delay fiber-optic cable 252, improves the signal to noise ratio of a frequency discriminator. Thus, a small variation in frequency will provide a large variation in the DC signal provided by the frequency discriminator. Unfortunately, a small rate of change in frequency also produces large variation in video phase shift at the discriminator output such that the phase margin required for a stable feedback loop is often exceeded causing the loop to be unstable. With a short delay line, a larger rate of change in frequency is required to provide a like amount of voltage change in the output signal of the frequency discriminator as a long delay line, but a larger rate of change in frequency is allowed before the phase margin of the feedback loop is exceeded causing the feedback loop to be unstable. With the latter in mind, it becomes apparent with a small variation of frequency and a small rate of change of frequency about the carrier frequency it is desirable to have a long delay line, but with a large variation of frequency and a large rate of change of frequency about the carrier frequency it is desirable to have a short delay line. By using both a long delay line and a short delay line the advantages of both types of delay lines may be utilized.

The modulated laser 228, the long delay fiber-optic cable 252, the photo detector 232, the phase shifter 220, the phase detector 224, and the loop amplifier 236 provide the elements required for a long delay line frequency discriminator. The modulated laser 230, the short delay fiber-optic cable 254, the photo detector 234, the phase shifter 222, the phase detector 226, and the loop amplifier 238 provide the elements required for a short delay line frequency discriminator. For a variation in frequency close to the carrier frequency, the long delay line frequency discriminator should dominate. Since such a variation in frequency will produce a low frequency output at the output of the detectors 224 and 226 the lowpass filter 240 will allow such a signal to pass through to the summing network 244 and the fine control port 250, while the bandpass filter 242 will prevent such a signal from passing through thus selecting the long delay line frequency discriminator. For a variation in frequency far from the carrier frequency, the short delay line frequency discriminator should dominate. Since such a variation in frequency will produce a higher frequency output at the output of the detectors 224 and 226, the bandpass filter 242 will allow such a signal to pass through to the summing network 244 and the fine control port 250, while the lowpass filter 240 will prevent such a signal from passing through thus selecting the short delay line frequency discriminator. With such an arrangement, the advantages of both a short delay line frequency discriminator and a long delay line frequency discriminator are obtained for providing the control signal to the fine control port 250 of the YTO 212.

It is also possible, rather than using the bandpass filter 242, to use two lowpass filters with a second lowpass filter replacing the bandpass filter 242 and having a higher cutoff frequency than the lowpass filter 240. The low frequency gain of the loop using lowpass filter 240 will be larger than that of the loop using the other lowpass filter but the high frequency gain of the loop using the low pass filter replacing the bandpass filter 242 will be larger than that of the loop using lowpass filter 240. Therefore, the long-delay loop dominates for low offset frequencies from the carrier and the short-delay loop dominates for high offset frequencies from the carrier. The advantage of not using a bandpass filter is that both loops have gain at DC which will prevent the loop amplifiers 236 and 238 from going into DC saturation and electronically unlocking the loops.

It should be appreciated, the above-described circuit could be modified by eliminating the power divider 218 and the modulated laser 230 and at an appropriate distance from the input end of the fiber-optic cable 252, an optical coupler could couple a portion of the optical signal within the fiber-optic cable 252 to the input of the photo detector 234. A remaining portion of the optical signal would then propagate to the photo detector 232. With such an arrangement, the FM noise within the microwave oscillator 200 is decreased at frequencies close to the center frequency of the oscillator 212 and also at higher offset frequencies away from the center frequency of the oscillator 212.

Figure 4:
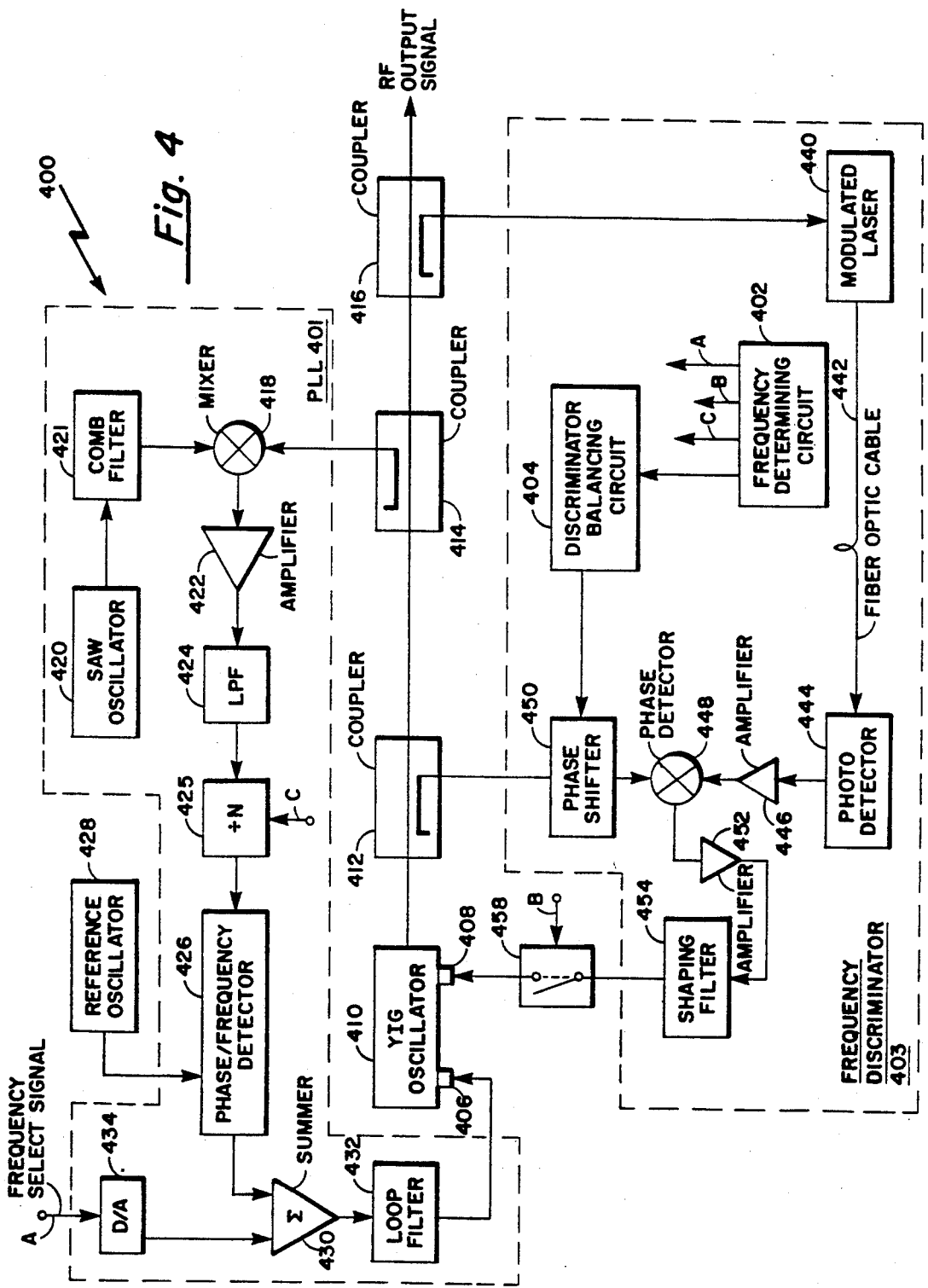
FIG. 4 is block diagram of still another alternate embodiment of a low noise oscillator according to this invention.

Referring now to FIG. 4, a microwave frequency signal source 400 is shown to include a yttrium-iron-garnet (YIG) tuned oscillator 410 (hereinafter referred to as YIG oscillator 410) having a coarse control port 406, a fine control port 408 and an output port. The YIG oscillator 410 provides an output signal at the output port, the output signal having an output frequency, here within C-band. The output port of the YIG oscillator 410 is connected to an input of a coupler 412 having a first and a second output. The first output of the coupler 412 is connected to an input of a coupler 414 having a first and a second output. The first output of the coupler 414 is connected to an input of a coupler 416 having a first and a second output. The first output of the coupler 416 provides an RF output signal which is the output signal of the microwave frequency signal source 400.

The second output of the coupler 414 is connected to an input of a phase-lock loop (PLL) 401 having also an output which is connected to the coarse control port 406 of the YIG oscillator 410. The PLL 401 includes a mixer 418 having an input which is the input of the PLL 401, the mixer 418 having also a second input and an output. A SAW oscillator 420 is connected to an input of a comb filter 421 having an output connected to the second input of the mixer 418. The mixer 418 is capable of heterodyning a portion of the output signal from the YIG oscillator 410 coupled to the mixer by the coupler 414 with an output signal from the SAW oscillator 420 to provide an intermediate frequency (IF) signal at the output of the mixer 418. The output of the mixer 418 is connected to an input of an amplifier 422 wherein the IF signal is amplified and provided at an output of the amplifier 422. The output of the amplifier 422 is connected to the input of a low pass filter 424 wherein the amplified IF signal is filtered. An output of the low pass filter 424 is connected, via a divider 425, to a first input of a phase/frequency detector 426 having also a second input and an output. A reference oscillator 428 provides an input signal to the second input of the phase/frequency detector 426. The output of the phase/frequency detector 426 is connected to a summing circuit 430 having also a second input and an output. The second input of the summing circuit 430 is provided from a D/A converter 434. The output of the summer 430 is connected to an input of a loop filter 432 having also an output which is the output of the PLL 401 which is connected to the coarse control port 406 of the YIG oscillator 410.

Following frequency initialization, wherein a frequency select signal is applied to the D/A 434 which in turn provides an analog signal to the second input of the summing circuit 430, and a new divider modulus is input to divider 425, the phase/frequency detector 426 acts as a discriminator and develops an output signal which is fed to the first input of the summing circuit 430. A coarse control signal is provided at the output of the summing circuit 430 and after being filtered by the loop filter 432 is fed to the coarse control port 406 of the YIG oscillator 410 to change the output frequency of the YIG oscillator 410 from an initialization frequency to within a capture range of a loop about the selected frequency. When the capture range is reached, the phase/frequency detector 426 takes on the characteristics of a phase detector and generates a control signal required for phase lock for the PLL 401 to operate.

It will be appreciated by those of skill in the art, to change the output frequency of the YIG oscillator 410, a new frequency select signal is provided from a frequency determining circuit 402 to the D/A 434 and to the variable modulus digital divider 425 corresponding to the desired output frequency of the microwave frequency signal source 400. The latter will cause the phase/frequency detector 426 to jump lock and again act as a discriminator and develop an output signal that changes the frequency of the output signal of the YIG oscillator 410 from the previous frequency to a new frequency within a capture range of the loop about the new selected frequency. The phase/frequency detector 426 again takes on the characteristics of a phase detector and generates the control signal required for phase lock at the new selected frequency.

The microwave frequency signal source 400 further includes a frequency discriminator 403 to provide a fine control signal to the YIG oscillator 410. The frequency discriminator 403 includes a modulated laser 440 having an input and an output, the input connected to the second output of the coupler 416. The output of the modulated laser is connected to an input end of a fiber-optic cable 442. An output end of the fiber-optic cable 442 is connected to an input of a photo detector 444 having also an output which is connected to an input of an amplifier 446. An output of the amplifier 446 is connected to a second input of a phase detector 448 having also a first input and an output.

The second output of the coupler 412 is connected to an input of a phase shifter 450 having also an output and a control port. The output of the phase shifter 450 is connected to the first input of the phase detector 448. A control signal is fed to the control port of the phase shifter 450 from a discriminator balancing circuit 404 having an input which is connected to the frequency determining circuit 402. The output of the phase detector 448 is connected to an input of an amplifier 452. An output of the amplifier 452 is connected to an input of a shaping filter 454 also having an output which is the output of the frequency discriminator 403 which is connected to the fine control port of the YIG oscillator 410 via the switch 458. With such an arrangement, the fine control signal is fed to the fine control port 408 of the YIG oscillator 410 to reduce FM noise in the output signal of the YIG oscillator 410 and as such, dither in the output frequency of the output signal of the microwave frequency signal source 400 is reduced.

Looking now at signal flow, a portion of the output signal of the YIG oscillator 410 is coupled, via coupler 416, to the modulated laser 440 wherein an optical output signal is provided in response to the input signal. As described earlier in more detail with references to FIG. 1 and FIG. 2, the optical output signal of the modulated laser 440 is amplitude modulated at a modulation rate in accordance with the frequency of the input signal. Thus, the amount of AM modulation in the optical signal is indicative of the output frequency of the microwave frequency signal source 400. The optical output signal is fed to the input end of the fiber-optic cable 442, here providing a fiber-optic delay line with a time delay of one microsecond. The optical signal is then fed to the photo detector 444 wherein the photo detector 444 provides an output signal having a frequency corresponding with the output signal of the YIG oscillator 410 but delayed in time by one microsecond. The output signal of the photo detector 444 is then amplified by the amplifier 446 and fed to the second input of the phase detector 448.

Another portion of the output signal of the YIG oscillator 410 is also coupled, via coupler 412, to the first input of the phase shifter 450 wherein said signal is phase shifted a predetermined amount as determined by a control signal fed to a control port of the phase shifter 450 such that the signal fed to the first input of the phase detector 448 will be in phase quadrature with the signal at the second input of phase detector 448. The phase detector 448 provides an output signal having a voltage indicative of the phase difference between the two input signals. The output signal of the phase detector 448 is then amplified by the amplifier 452 and filtered by the shaping filter 454 and fed as the fine control signal to the fine control port 408 of the YIG oscillator 410 when the switch 458 is in a closed position. As such, an undesired change of frequency in the output signal of the microwave frequency signal source will result in a change in the output signal of the phase detector 448 which in turn changes the fine control signal fed to the fine control port 408 of the YIG oscillator 410. The latter minimizes FM noise in the output signal of the microwave frequency signal source 400.

During frequency initialization, the frequency determining circuit 402 provides a control signal to the switch 458 to open the switch 458 to the open position. The latter breaks the connection of the fine control signal from the fine control port 408 of the YIG oscillator 410. A frequency select signal is then applied to the D/A 434 to provide a new coarse control signal to the coarse control port 406 of the YIG oscillator 410. Once the PLL 401 about the YIG oscillator 410 has achieved phase lock, the frequency determining circuit 402 provides a control signal to the switch 458 to close the switch 458 to the close position. The frequency discriminator 403 then operates in the manner as described hereinabove to minimize FM noise in the output signal of the microwave frequency signal source 400. When changing the output frequency of the YIG oscillator 410, the switch 458 is opened and a new frequency select signal is fed to the PLL 401. Once the PLL 401 about the YIG oscillator 410 has again achieved phase lock, the switch 458 is closed and the frequency discriminator 403 continues to operate at the new frequency.

It should now be apparent, a microwave frequency signal source is provided having reduced phase noise, yet a broad bandwidth. Such a signal source used within a radar will extend the maximum detection range of the radar. Unlike previous delay lines provided by coaxial cable or waveguide which are bulky, vibration sensitive, and provide excessive attenuation, the fiber-optic delay line with the photo detector and modulated laser has a small, but constant optical loss independent of microwave frequency, thus providing an equal time delay within a large band of microwave frequencies. The latter allows the frequency discriminator to provide a fine control signal to the YIG oscillator which will more readily reduce FM noise within the microwave frequency signal source.

Figure 5:
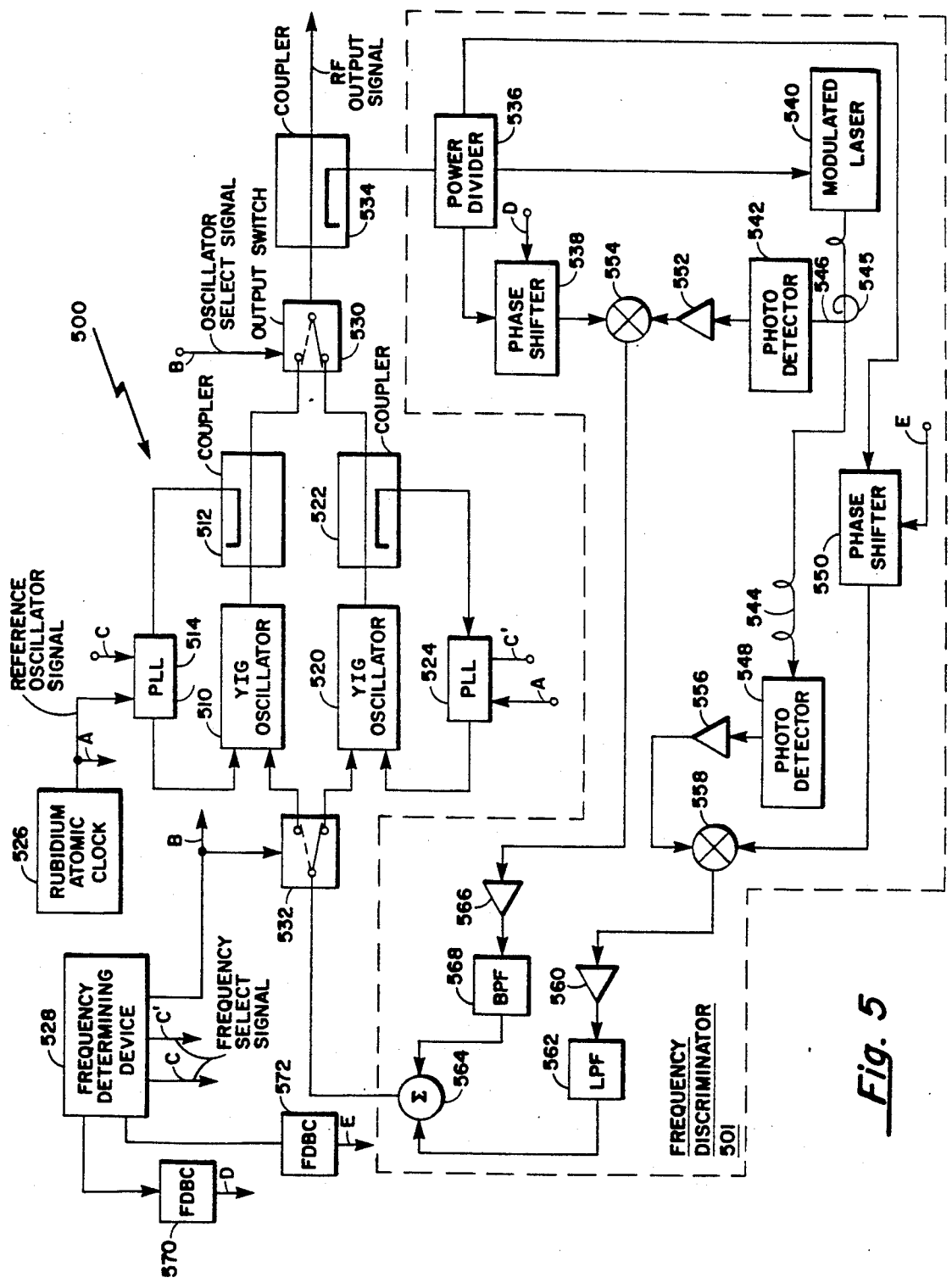
FIG. 5 is block diagram of a stable frequency signal source according to this invention.

Referring now to FIG. 5, a stable frequency signal source 500 is shown to include a YIG oscillator 510 and a YIG oscillator 520. Each one of the YIG oscillators 510 and 520 provides an output signal with a predetermined frequency in response to a coarse control signal fed to a coarse control port and a fine control signal fed to a fine control port of each one of the YIG oscillators 510 and 520.

An output of the YIG oscillator 510 is connected to an input of a coupler 512 having a first and a second output. The first output of the coupler 512 is connected to a first input of a switch 530 having also a second input and an output. The second output of the coupler 512 is connected to an input of a phase-lock loop (PLL) 514.

An output of the PLL 514 provides the coarse control signal to the YIG oscillator 510. A rubidium atomic clock 526 provides a reference oscillator signal to the PLL 514. A frequency determining device 528 provides a frequency select signal to the PLL 514 to determine the desired output frequency of the YIG oscillator 510. The PLL 514 operates in a manner similar to the PLL 401 of FIG. 4.

An output of the YIG oscillator 520 is connected to an input of a coupler 522 having also a first output and a second output. The first output of the coupler 522 is connected to the second input of the switch 530. The second output of the coupler 522 is connected to an input of the phase-lock loop (PLL) 524. An output of the PLL 524 provides the coarse control signal to the YIG oscillator 520. The rubidium atomic clock 526 provides the reference oscillator signal to the PLL 524. The frequency determining device 528 provides a frequency select signal to the PLL 524 to determine the desired output frequency of the YIG oscillator 520. The PLL 524 also operates in a manner as described with the PLL 401 of FIG. 4.

An output of the switch 530 is connected to an input of a coupler 534 having a first and a second output. The first output of the coupler 534 provides the output of the stable frequency signal source 500. The switch 530, in response to a control signal from the frequency determining device 528, either selects the output of the YIG oscillator 510 or the output of the YIG oscillator 520 and provides the selected output as the output of the stable frequency signal source 500.

The second output of the coupler 534 is connected to an input of a frequency discriminator 501 having also an output which provides the fine control signal to either the YIG oscillator 510 or the YIG oscillator 520 when selected. The frequency discriminator 501 includes a power divider 536 having an input which is the input of the frequency discriminator 501, the power divider 536 further having a first, a second and a third output. The first output of the power divider 536 is connected to an input of voltage-controlled phase shifter 538. An output of the phase shifter 538 is connected to a first input of a phase detector 554 having also a second input and an output. A second output of the power divider 536 is connected to an input of a voltage-controlled phase shifter 550. An output of the phase shifter 550 is connected to a first input of a phase detector 558 having also a second input and an output.

A third output of the power divider 536 is connected to an input of a modulated laser 540. An output of the modulated laser 540 is connected to an input end of a long delay fiber-optic cable 544. An output end of the long delay fiber-optic cable 544 is connected to an input of a photo detector 548. An output of the photo detector 548 is connected to an input of an amplifier 556 having also an output which is connected to the second input of the phase detector 558. A short delay fiber-optic cable 546 includes a first end with a coupling loop 545 disposed about a portion of the long delay fiber-optic cable 544. A second end of the short delay fiber-optic cable 546 is connected to an input of a photo detector 542. An output of the photo detector 542 is connected to an input of an amplifier 552 having also an output which is connected to the second input of the phase detector 554.

A control signal is fed from the frequency determining device 528 to a frequency discriminator balancing circuit (FDBC) 572 which provides a control signal to the phase shifter 550 to ensure a proper amount of phase shift is imparted to a signal fed thereto such that the signals fed to the two inputs of the phase detector 558 are in phase quadrature. A control signal is also fed from the frequency determining device 528 to a frequency discriminator balancing circuit 570 which provides a control signal to the phase shifter 538 to ensure a proper amount of phase shift is imparted to a signal fed thereto such that the signals fed to the two inputs of the phase detector 554 are in phase quadrature.

The output of the phase detector 558 is connected to an input of a loop amplifier 560 having also an output which is connected to an input of a lowpass filter 562. An output of the lowpass filter 562 is connected to a first input of a summing network 564 having also a second input and an output. The output of the phase detector 554 is connected to an input of a loop amplifier 566 having also an output which is connected to an input of a bandpass filter 568. An output of the bandpass filter 568 is connected to the second input of the summing network 564. The output of the summing network 564 is connected to an input of a switch 532 having also a first and a second output. The first output of the switch 532 is connected to the fine control port of the YIG oscillator 510 and a second output of the switch 532 is connected to the fine control port of the YIG oscillator 520.

It should be appreciated, the stable frequency signal source 500 includes a frequency discriminator 501 with two delay lines which operates in a manner similar to that as shown in connection with FIG. 3. A long delay line, provided by the long delay fiber-optic cable 544, is used to discern the phase noise close to the output frequency of the output signal of the stable frequency signal source 500. A control loop with the loop amplifier 560 and the lowpass filter 562 is used to degenerate the phase noise close to the output frequency. At higher offset frequencies from the output frequency, a short delay line, provided by the short delay line fiber-optic cable 546, degenerates the phase noise further away from the output frequency.

The modulated laser 540 the long delay fiber-optic cable 544, the photo detector 548, the amplifier 556, the phase shifter 550, the phase detector 558 and the loop amplifier 560 provide the elements required for a long delay line frequency discriminator. The modulated laser 540, a portion of the long delay fiber-optic cable 544, the short delay fiber-optic cable 546 with the coupling loop 545, the photo detector 542, the amplifier 552, the phase shifter 538, the phase detector 554 and the loop amplifier 566 provide the elements required for a short delay line frequency discriminator. For a variation in frequency close to the output frequency, the long delay line frequency discriminator will dominate and since such a variation in frequency will produce a low frequency output at the output of the detectors 554 and 558, the lowpass filter 562 will allow such a signal to pass through whereas the bandpass filter 568 will prevent such a signal from passing through, thus selecting the long delay line frequency discriminator. With a larger variation about the output frequency, the short delay line frequency discriminator will dominate and since such a variation in frequency will produce a higher frequency at the output of the phase detectors 554 and 558, the bandpass filter 568 will allow such a signal to pass through while the lowpass filter 562 will prevent such a signal from passing through, thus selecting the short delay line frequency discriminator. With such an arrangement, the advantages of both the short delay line frequency discriminator and the long delay line frequency discriminator are obtained.

It should be appreciated, the time required for a phase-lock loop to obtain phase-lock about a YIG oscillator is much longer than the time required for a frequency discriminator to achieve balance. In an application where it is necessary for multiple frequencies to be provided by the stable frequency signal source 500 very quickly, the present embodiment provides such a solution. If the YIG oscillator 510 is tuned to a first output frequency and the YIG oscillator 520 is tuned to a second output frequency, then the switch 530 can either select the YIG oscillator 510 with the first output frequency or the YIG oscillator 520 with the second output frequency. If a third frequency is needed, a new frequency select signal corresponding to the third frequency is sent to the YIG oscillator not in use in anticipation of being required to provide an output signal with the new output frequency, while the other YIG oscillator continues to operate and provide the output signal for the stable frequency signal source 500. The switch 532, responsive to a control signal from the frequency determinating device 528, connects the output signal from the frequency discriminator 501 to the selected one of the YIG oscillators 510, 520. Once the non-selected YIG oscillator is operating at the new output frequency, when the new output frequency is needed, the frequency determining device 528 provides control signals to the switch 530 and the switch 532 to select the other one of the YIG oscillators 510 and 520 to provide the output signal with the new output frequency for the stable frequency signal source 500. With such an arrangement, the stable frequency signal source 500 can change output frequencies at a faster rate.

Having described a preferred embodiment of the invention, it will now become apparent to one of skill in the art that other embodiments incorporating its concepts may be used. For example, in radio astronomy, very low phase noise is required very close to the radio frequency carrier. In such an application, a fiber-optic delay line with a time delay greater than 100 microseconds could be utilized. Furthermore, a frequency discriminator could have three or more time delay loops, if necessary. It is felt, therefore, that these embodiments should not be limited to the disclosed embodiments but rather should be limited only by the spirit and scope of the appending claims.

What is claimed is:

1. A signal source comprising:
   (a) an oscillator having an output and a control port; and
   (b) a feedback circuit disposed between the output and the control port of the oscillator, the feedback circuit comprising:
      (i) a modulated laser, having an input and an output, the input coupled to the output of the oscillator;
      (ii) a fiber-optic cable having a first end and a second end, the first end connected to the output of the modulated laser; and
      (iii) a photo detector having an input and an output, the input connected to the second end of the fiber-optic cable.

2. The signal source as recited in claim 1 wherein the fiber-optic cable has a length to provide a determined amount of time delay.

3. The signal source as recited in claim 1 further comprising a detector having a first and a second input and an output, the first input coupled to the output of the photo detector, the second input coupled to the output of the oscillator and the output of the detector coupled to the control port of the oscillator.

4. The signal source as recited in claim 3 further comprising a voltage-controlled phase shifter disposed between the output of the oscillator and the input of the detector.

5. A microwave oscillator comprising:
(a) means, responsive to a control signal, for providing an output signal with an output frequency; and
(b) means, responsive to a portion of the output signal, for providing the control signal to reduce variation of the frequency of the output signal, wherein the control signal providing means comprises:
(i) a modulated laser, having an input and an output, the input coupled to the output signal;
(ii) a fiber-optic cable having a first end and a second end, the first end connected to the output of the modulated laser; and
(iii) a photo detector having an input and an output, the input connected to the second end of the fiber-optic cable.

6. The signal source as recited in claim 5 wherein the fiber-optic cable has a length to provide a predetermined amount of time delay.

7. The microwave oscillator as recited in claim 5 further comprising a detector having a first and a second input and an output, the first input coupled to the output of the photo detector and the second input coupled to the output signal.

8. The microwave oscillator as recited in claim 7 further comprising a voltage-controlled phase shifter disposed between the output signal and the input of the detector.

9. A microwave frequency signal source comprising:
(a) means, responsive to a control signal, for providing a microwave frequency output signal;
(b) means, responsive to a portion of the microwave frequency output signal, for providing a modulated optical signal, the modulated optical signal time delayed by a predetermined amount of time;
(c) means, responsive to the time delayed modulated optical signal, for providing a microwave feedback signal;
(d) means, responsive to the microwave feedback signal and a portion of the microwave frequency output signal, for providing the control signal for the microwave frequency output signal providing means.

10. The microwave frequency signal source as recited in claim 9 wherein the modulated optical signal providing means comprises a fiber-optic cable to delay a signal fed thereto by a predetermined amount of time.

11. The microwave frequency signal source as recited in claim 10 further comprising:
(a) first means for coupling a portion of the microwave frequency output signal to the modulated optical signal providing means; and
(b) second means for coupling a portion of the microwave frequency output signal to the control signal providing means.

12. The microwave frequency signal source as recited in claim 11 wherein the control signal providing means comprises:
(a) a phase detector having a first and a second input and an output, the second input coupled to the microwave feedback signal;
(b) a phase shifter having an input and an output, the output connected to the first input of the phase detector and the input connected to the second coupling means;
(c) an amplifier having an input and an output, the input of the amplifier connected to the output of the phase detector; and
(d) a filter having an input and an output, the input of the filter connected to the output of the amplifier and the output of the filter providing the control signal.

13. A signal source comprising:
(a) an oscillator having an output and a control port; and
(b) a feedback circuit disposed between the output and the control port of the oscillator, the feedback circuit comprising:
(i) a first modulated laser, having an input and an output, the input coupled to the output of the oscillator;
(ii) a second modulated laser, having an input and an output, the input coupled to the output of the oscillator;
(iii) a first photo detector having an input and an output;
(iv) a second photo detector having an input and an output;
(v) a first fiber-optic cable having a first end and a second end, the first end connected to the output of the first modulated laser and the second end connected to the input of the first photo detector; and
(vi) a second fiber-optic cable having a first end and a second end, the first end connected to the output of the second modulated laser and the second end connected to the input of the second photo detector.

14. The signal source as recited in claim 13 wherein the first fiber-optic cable has a length to provide a first predetermined amount of the delay and the second fiber-optic cable has a length to provide a second different predetermined amount of the delay.

15. The signal source as recited in claim 13 further comprising:
(a) a first detector having a first and a second input and an output, the first input coupled to the output of the first photo detector, the second input coupled to the output of the oscillator;
(b) a second detector having a first and a second input and an output, the first input coupled to the output of the second photo detector, the second input coupled to the output of the oscillator; and
(c) a summing network having a first and a second input and an output, the first input coupled to the output of the first detector, the second input coupled to the output of the second detector and the output coupled to the control port of the oscillator.

16. The signal source as recited in claim 15 further comprising:
(a) a first voltage-controlled phase shifter disposed between the output of the oscillator and the input of the first detector to provide a quadrature phase relationship between a signal at the first input and a signal at the second input of the first detector; and
(b) a second voltage-controlled phase shifter disposed between the output of the oscillator and the input of the second detector to provide a quadrature phase relationship between a signal at the first input and a signal at the second input of the second detector.

* * * * *